(12) United States Patent
Emura

(10) Patent No.: US 8,466,487 B2
(45) Date of Patent: Jun. 18, 2013

(54) LIGHT EMITTING ELEMENT WITH EXTENDED ELECTRODES STRUCTURE

(75) Inventor: Keiji Emura, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/187,667

(22) Filed: Jul. 21, 2011

(65) Prior Publication Data

US 2012/0018766 A1    Jan. 26, 2012

(30) Foreign Application Priority Data

Jul. 23, 2010   (JP) .................................. 2010-165411
Aug. 30, 2010   (JP) .................................. 2010-192077

(51) Int. Cl.
*H01L 33/00*   (2010.01)

(52) U.S. Cl.
USPC .................................... 257/99; 257/E33.066

(58) Field of Classification Search
USPC .............. 257/99, 687, 82, E33.001, E33.062, 257/E33.065, E33.066, E25.019
See application file for complete search history.

(56) References Cited

U.S. PATENT DOCUMENTS

| 6,650,018 | B1 | 11/2003 | Zhao et al. | |
|---|---|---|---|---|
| 6,777,805 | B2 | 8/2004 | Uemura et al. | |
| 7,042,089 | B2 | 5/2006 | Uemura et al. | |
| 7,193,245 | B2 | 3/2007 | Zhao et al. | |
| 7,642,183 | B2 | 1/2010 | Zhao et al. | |
| 2004/0041160 | A1 | 3/2004 | Zhao et al. | |
| 2005/0236637 | A1* | 10/2005 | Zhao et al. | 257/99 |
| 2007/0228388 | A1 | 10/2007 | Ko et al. | |
| 2009/0212307 | A1 | 8/2009 | Baur et al. | |
| 2009/0283789 | A1 | 11/2009 | Kim et al. | |
| 2010/0006885 | A1* | 1/2010 | Gong | 257/99 |
| 2010/0163910 | A1 | 7/2010 | Bougrov et al. | |
| 2011/0156086 | A1* | 6/2011 | Kim et al. | 257/99 |
| 2011/0163346 | A1 | 7/2011 | Seo et al. | |
| 2011/0215363 | A1* | 9/2011 | Kimura et al. | 257/99 |

FOREIGN PATENT DOCUMENTS

| JP | 2001-345480 A | 12/2001 |
|---|---|---|
| JP | 2002-319704 A | 10/2002 |
| JP | 2007-281426 A | 10/2007 |
| JP | 2008-159957 A | 7/2008 |
| JP | 2008-543068 A | 11/2008 |
| JP | 2009-278056 A | 11/2009 |

(Continued)

*Primary Examiner* — Wensing Kuo
*Assistant Examiner* — Moazzam Hossain
(74) *Attorney, Agent, or Firm* — Global IP Counselors, LLP

(57) ABSTRACT

A semiconductor light emitting element has a first electrode and a second electrode provided on a semiconductor layer; the first electrode has a first external connector and a first extended portion and second extended portion that extend from the first external connector, the second electrode has a second external connector, and a third extended portion, a fourth extended portion, and a fifth extended portion that extend from the second external connector, the third extended portion extends along the first extended portion and farther outside than the first extended portion, the fourth extended portion extends along the second extended portion and farther outside than the second extended portion, and the fifth extended portion extends an area between the third extended portion and the fourth extended portion to the first external connector side, and the fifth extended portion is either on a line that links a point on the first extended portion at the position closest to the second external connector and a point on the second extended portion at the position closest to the second external connector, or closer to the second external connector side than the line.

12 Claims, 11 Drawing Sheets

| | FOREIGN PATENT DOCUMENTS | | | JP | 2011-187670 A | 9/2011 |
|---|---|---|---|---|---|---|
| JP | 2010-051165 | * | 3/2010 | KR | 20090132998 * | 12/2009 |
| JP | 2010-530628 A | | 9/2010 | | | |
| JP | 2011-142324 A | | 7/2011 | * cited by examiner | | |

US 8,466,487 B2

LIGHT EMITTING ELEMENT WITH EXTENDED ELECTRODES STRUCTURE

CROSS-REFERENCE TO RELATED APPLICATIONS

This application claims priority to Japanese Applications No. 2010-165411 and 2010-192077 filed in Japan on Jul. 23 and Aug. 30, 2010. The entire disclosure of Japanese Applications No. 2010-165411 and 2010-192077 is incorporated hereinto by reference.

FIELD OF THE INVENTION

This invention relates to a light emitting element, and more particularly to an electrode structure of the light emitting element.

BACKGROUND INFORMATION

Various kinds of light emitting element have been developed in the past in order to allow light to be emitted uniformly. For example, there is an electrode structure for a light emitting element in which either the p-side electrode or the n-side electrode is disposed in the center of the top face of the light emitting element, and the other electrode is disposed so as to surround the periphery of the first one (see Patent Literature 1: JP2002-319704-A).

However, when the electrode structure such as this is actually put to use, there inevitably ends up being a bias in the distribution of current density between the p-side electrode and n-side electrode, the forward voltage (Vf) is higher, and this structure is inadequate for obtaining uniform light emission.

The present invention was conceived in light of this situation, and it is an object thereof to provide a light emitting element with which there is little bias in the distribution of current density between the electrodes.

SUMMARY OF THE INVENTION

A light emitting element [1] of the present invention has a first electrode and a second electrode provided on a semiconductor layer;

the first electrode has a first external connector and a first extended portion and second extended portion that extend from the first external connector, the second electrode has a second external connector, and a third extended portion, a fourth extended portion, and a fifth extended portion that extend from the second external connector, the third extended portion extends along the first extended portion and farther outside than the first extended portion, the fourth extended portion extends along the second extended portion and farther outside than the second extended portion, and the fifth extended portion extends an area between the third extended portion and the fourth extended portion to the first external connector side, and the fifth extended portion is either on a line that links a point on the first extended portion at the position closest to the second external connector and a point on the second extended portion at the position closest to the second external connector, or closer to the second external connector side than the line.

With the light emitting element pertaining to the present invention, the distribution of current density between electrodes can be made more uniform.

DETAILED DESCRIPTION OF THE PREFERRED EMBODIMENTS

The embodiments of the present invention will be described below making reference to the figures. The size, positional relationships, and so forth of the members illustrated in the various diagrams may be exaggerated in order to make the description more clear. Furthermore in the following description, those members which are the same or equivalent are denoted by the same name and reference number and detailed description thereof will be omitted as suitable.

First Embodiment

Figure 1:
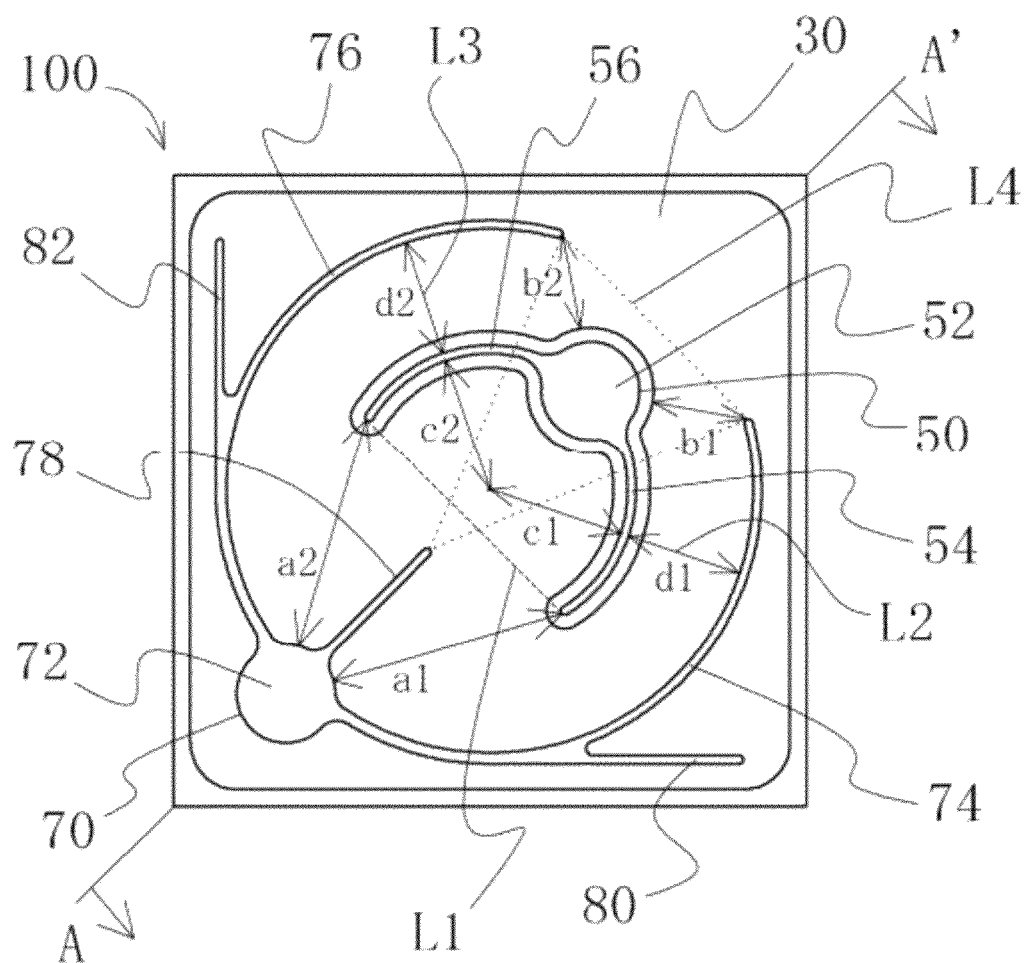
FIG. 1 is a plan view schematically illustrating the light emitting element pertaining to a first embodiment.
Figure 2:
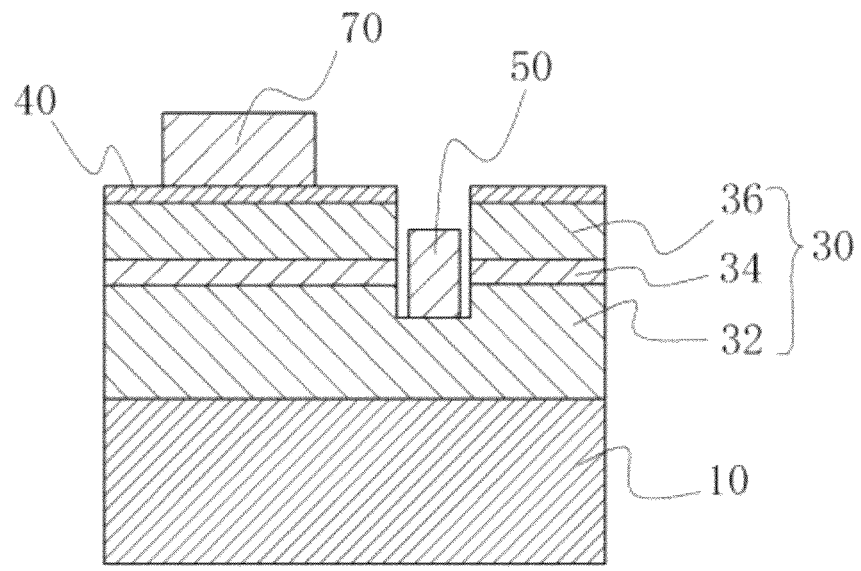
FIG. 2 is a cross sectional view of A-A' line of the FIG. 1 schematically illustrating the light emitting element pertaining to a first embodiment.

FIG. 1 is a plan view schematically illustrating the light emitting element pertaining to a first embodiment, and FIG. 2 is a cross sectional view of A-A' line of the FIG. 1 schematically illustrating the light emitting element pertaining to a first embodiment;

As shown in FIGS. 1 and 2, the light emitting element 100 pertaining to a first embodiment has at least a substrate 10, a semiconductor layer 30 provided on the substrate 10, and a first electrode 50 and second electrode 70 provided on the semiconductor layer 30.

The first electrode 50 has a first external connector 52 and a first extended portion 54 and second extended portion 56 that extend from the first external connector.

The second electrode 70 has a second external connector 72, and a third extended portion 74, a fourth extended portion 76, and a fifth extended portion 78 that extend from the second external connector 72.

The third extended portion 74 extends along the first extended portion 54 and farther outside than the first extended portion 54, and the fourth extended portion 76 extends along the second extended portion 56 and farther outside than the second extended portion 56. That is, the shortest distances from more than one point on the first extended portion 54 to the third extended portion 74 are the same, or the first extended portion 54 is disposed at even intervals from the third extended portion 74 over a predetermined length. It also means that the shortest distances from more than one point of the second extended portion 56 to the fourth extended portion 76 are the same, or the second extended portion 56 is disposed at even intervals from the fourth extended portion 76 over a predetermined length. Further, the extensions are disposed so that the shortest distances from the first extended portion 54 to the third extended portion 74 and from the second extended portion 56 to the fourth extended portion 76 are the same.

Generally, a current flow is concentrated when extended portions of electrodes are close to each other, and a current does not flow when extended portions of electrodes are far from each other. Therefore, various distances between extended portions cause uneven current density. Meanwhile, the above-mentioned disposition of the first to the fourth extended portions prevents uneven current density.

The fifth extended portion 78 extends the area between the third extended portion 74 and the fourth extended portion 76 to the first external connector 52 side. The fifth extended portion 78 is either on a line $L_1$ that links a point on the first extended portion 54 at the position closest to the second external connector 72 and a point on the second extended portion 56 at the position closest to the second external connector 72, or more to the second external connector 72 side than the line $L_1$.

In this Specification, on is the upward direction in FIG. 2, referring to the side on which the first electrode 50 and the second electrode 70 are provided with respect to the semiconductor layer 30.

Consequently, part of the current flow that is concentrated between the first external connector 52 and the second external connector 72 can be spread out over the areas where current tends to be lacking, such as between the first extended portion 54 and the third extended portion 74, or between the second extended portion 56 and the fourth extended portion 76. Accordingly, the distribution of current density between the electrodes can be made more uniform.

More specifically, the light emitting element 100 pertaining to this embodiment has a substantially rectangular shape in top view, and an n-side semiconductor layer 32, an active layer 34, and a p-side semiconductor layer 36 are disposed in that order as the semiconductor layer 30 on the substrate 10. A pair of positive and negative electrodes are provided on the semiconductor layer 30, and the first electrode 50 (n-side electrode) that is electrically connected to the n-side semiconductor layer 32, and the second electrode 70 (p-side electrode) that is electrically connected to the p-side semiconductor layer 36 are provided.

The first electrode 50 is provided to the surface of the n-side semiconductor layer 32 exposed when parts of the active layer 34 and the p-side semiconductor layer 36 are removed. Meanwhile, the second electrode 70 is provided contacting with the surface of a translucent electrode 40 formed on substantially the entire upper surface of the p-side semiconductor layer 36.

Further, the first electrode 50 and the second electrode 70 respectively have the external connectors 52 and 72 that are electrically connected to external circuits (not shown), and the plurality of extended portions 54, 56, 74, 76, and 78 that extend from the external connectors 52 and 72, respectively.

In this embodiment, the external connector 52 of the first electrode (first external connector) and the external connector 72 of the second electrode (second external connector) are disposed opposite each other, with the semiconductor layer 30 in between, in the diagonal direction of the semiconductor layer 30, which has a substantially rectangular shape in top view. The first external connector 52 has the first extended portion 54 and second extended portion 56 that extend to the second external connector 72 side. The first extended portion 54 and the second extended portion 56 are disposed in a substantially arc-shaped pattern with the first external connector 52 in between in top view.

Meanwhile, the second external connector 72 has the third extended portion 74, the fourth extended portion 76, and the fifth extended portion 78 that extend to the first external connector 52 side. The third extended portion 74 extends the outside beyond the first extended portion 54 along the first extended portion 54. The fourth extended portion 76 extends the outside beyond the second extended portion 56 along the second extended portion 56.

The distance $a_1$ from the second external connector 72 to a point on the first extended portion 54 at the closest position to the second external connector 72 (the distal end of the first extended portion) is preferably longer than the distance $b_1$ from the first external connector 52 to a point on the third extended portion 74 at the closest position to the first external connector 52 (the distal end of the third extended portion), and the distance $a_2$ from the second external connector 72 to a point on the second extended portion 56 at the closest position to the second external connector 72 (the distal end of the second extended portion) is preferably longer than the distance $b_2$ from the first external connector 52 to a point on the fourth extended portion 76 at the closest position to the first external connector 52 (the distal end of the fourth extended portion).

Consequently, the current flowing between the first extended portion 54 or second extended portion 56 and the second external connector 72 of the p-side electrode, where the current tends to be more concentrated on the periphery region than at the first external connector 52 of the n-side electrode, can more easily spread out between the first external connector 52 of the n-side electrode and the third extended portion 74 or fourth extended portion 76.

The widths of the third extended portion 74 and the fourth extended portion 76 are preferably such that the widths on the second external connector 72 side are greater than the widths on the distal end side, and particularly those of the opposing portions along the first extended portion 54 and the second extended portion 56. Consequently, the sheet resistance on the second external connector 72 side decreases, the current can more easily spread out to the distal end side. Furthermore, the surface area of the electrodes on the semiconductor layer 30 can be reduced, rather than making the widths of the third extended portion 74 and the fourth extended portion 76 uniform, so there is less of a decrease in light extraction efficiency from the semiconductor layer 30.

Also, the fifth extended portion 78 in this embodiment extends the area between the third extended portion 74 and the fourth extended portion 76 linearly toward the first external connector 52. The distal end of the fifth extended portion 78 is disposed more to the second external connector 72 side than the line $L_1$ that links a point on the first extended portion 54 at the position closest to the second external connector 72 (the distal end of the first extended portion) and a point on the second extended portion 56 at the position closest to the second external connector 72 (the distal end of the second extended portion).

Consequently, there is less excessive concentration of current between the fifth extended portion 78 and the region bounded by the first external connector 52, the first extended portion 54 and second extended portion 56, and part of the restricted current can spread out between the first extended portion 54 and the third extended portion 74, and between the second extended portion 56 and the fourth extended portion 76.

Furthermore, the third extended portion 74 and the fourth extended portion 76 are preferably disposed opposite each other and so as to be substantially parallel to the first extended portion 54 and second extended portion 56, respectively, and even more preferably, the first extended portion 54 and second extended portion 56 are disposed in the form of arcs that are concentric with the third extended portion 74 and fourth extended portion 76.

Consequently, the current flowing between the first extended portion 54 and the third extended portion 74, and between the second extended portion 56 and the fourth extended portion 76 can be made more uniform. In particular, using a concentric arc shape minimizes the surface area on the semiconductor layer 30 that is accounted for by the electrodes, so there is less of a decrease in the light extraction efficiency from the semiconductor layer 30.

Also, in order from the center of these concentric arcs, on the line $L_2$ linking the first extended portion 54 and the third extended portion 74, the distance $c_1$ from the center of the concentric arcs to the first extended portion 54 is preferably the same as or longer than the distance $d_1$ from the first extended portion 54 to the third extended portion 74, and in order from the center of these concentric arcs, on the line $L_3$ linking the second extended portion 56 and the fourth extended portion 76, the distance $c_2$ from the center of the concentric arcs to the second extended portion 56 is preferably the same as or longer than the distance $d_2$ from the second extended portion 56 to the fourth extended portion 76.

Consequently, the current flow that tends to be concentrated between the first external connector 52 and the second external connector 72, and particularly near the center of the concentric arcs, can even more easily spread out between the first extended portion 54 and the third extended portion 74, and between the second extended portion 56 and the fourth extended portion 76.

The first external connector 52 in this embodiment is disposed within a region bounded by a line $L_4$ that links the distal ends of the third extended portion 74, the fourth extended portion 76, and the fifth extended portion 78 in top view. That is, the first external connector 52 is bounded by the lines $L_4$ that link the point on the third extended portion 74, the point on the fourth extended portion 76, and the point on the fifth extended portion 78 that are farthest from the second external connector 72.

Accordingly, the first external connector 52, in which the flow of current tends to be relatively concentrated, is disposed in a region where current tends to be lacking and the distance from the second external connector 72 is farther, and this compensates for the lack of current.

In this embodiment, there are two extended portions besides the above-mentioned first to fifth extended portions 54, 56, 74, 76, and 78, namely, a sixth extended portion 80 and a seventh extended portion 82. The sixth extended portion 80 branches off to the outside from the third extended portion 74 and extends to a corner adjacent to the corner where the second external connector 72 is disposed. The seventh extended portion 82 branches off to the outside from the fourth extended portion 76 and extends to a corner adjacent to the corner where the second external connector 72 is disposed.

Consequently, current can also be spread out to the corner of the semiconductor layer 30 where the external connectors 52 and 72 are not disposed and where current tends to be lacking.

With the light emitting element 100 pertaining to the first embodiment and having the constitution discussed above, the distribution of current density between the first electrode 50 and the second electrode 70 can be made more uniform.

(Substrate)

The substrate is mainly a member used to laminate semiconductor layers, and there are no particular restrictions on its size, thickness, etc., so long as it is a member on which a nitride semiconductor can be epitaxially grown. Examples of such substrate materials include sapphire ($Al_2O_3$), spinel ($MgAl_2O_4$), and other such insulating substrates, and silicon carbide (SiC), ZnS, ZnO, silicon, GaAs, diamond, and oxide substrates that form lattice bonds with a nitride semiconductor, such as lithium niobate and neodymium gallate.

(Semiconductor Layer)

The semiconductor layer is a member that serves as the light emitting component in the light emitting element, and is made up of at least an n type semiconductor layer, an active layer, and a p type semiconductor layer. There are no particular restrictions on the type of semiconductor layer or material, but a gallium nitride-based semiconductor material such as $In_xAl_yGa_{1-x-y}N$ ($0 \leq X$, $0 \leq Y$, $X+Y \leq 1$) can be used to advantage.

(Electrodes)

The electrodes are members for supplying current from the outside to the semiconductor layer, and include a first electrode and a second electrode as a pair of positive and negative electrodes on the same side of the semiconductor layer. The first electrode and the second electrode are disposed opposite each other with the semiconductor layer in between, and in a first embodiment, the first electrode is the n-side electrode and the second electrode is the p-side electrode, but this is not the only option, and the first electrode may be the p-side electrode and the second electrode the n-side electrode. The term "opposite" here means that two members are facing each other point to point, but also encompasses the meaning of facing each other plane to plane.

Nickel, rhodium, chromium, gold, tungsten, platinum, titanium, aluminum, or the like can be used as the material of these electrodes, but the use of a mutlilayer film comprising laminations of Ti/Pt/Au, Ti/Rh/Au, or the like in that order is preferable.

Also, the first electrode and the second electrode each comprise an external connector and an extended portion.

The external connector is a pad electrode for electrically connecting with an external circuit, such as a portion bonded with conductive wire or the like. The external connectors are preferably disposed more to the inside than the side face of the semiconductor layer in top view, and the forward voltage can be reduced by shrinking the distance between the external connectors. There are no particular restrictions on the shape of the external connectors, but a circular shape is preferable in terms of facilitating wire bonding, for example. Furthermore, in a first embodiment, the external connector of the first electrode (first external connector) and the external connector of the second electrode (second external connector) are disposed in the diagonal direction of the semiconductor layer in top view, but can also be disposed in the two opposing side face directions of the semiconductor layer.

The extended portions are auxiliary electrodes for uniformly diffusing into the semiconductor layer the current supplied to the external connectors.

At least a first extended portion and a second extended portion are provided as extended portions for the first electrode, and each extend from the first external connector to the second external connector side. The shape of the first and second extended portions can be arc-shaped, linear, or any other shape that is desired, but the first and second extended portions are preferably disposed in symmetry with respect to the a line linking the first external connector and the second external connector.

At least a third extended portion, a fourth extended portion, and a fifth extended portion are provided as extended portions of the second electrode, and each extends from the second external connector to the first external connector side.

The third extended portion that extends from the second external connector extends the outside beyond the first extended portion, that is, the side face side of the semiconductor layer is extended along the first extended portion.

The fourth extended portion is extended from the second external connector to the opposite side from the third extended portion, and extends the outside beyond the second extended portion (the side face side of the semiconductor layer) along the second extended portion. ("Opposite side" here means the opposite side in reference to a line that links the first external connector and the second external connector).

There are no particular restrictions on the shape of the fifth extended portion, but it is disposed at least on a line that links a point on the first extended portion at the position closest to the second external connector, and a point on the second extended portion at the position closest to the second external connector, or more to the second external connector side than this line.

(Translucent Electrode)

A translucent electrode is provided over substantially the entire surface of the top face of the p type semiconductor layer, and is a member that serves to direct the current supplied from the p-side electrode uniformly over the entire plane of the p type semiconductor layer. The translucent electrode is disposed on the light extraction side of the semiconductor element, so a conductive oxide is preferably used as the material. A metal thin film can also be used as the translucent electrode, but since a conductive oxide has better translucency than a metal thin film, the semiconductor element can be made into a light emitting element with higher emission efficiency. Examples of such conductive oxides include oxides including at least one element selected from among zinc, indium, tin, and magnesium, and more specifically, ZnO, $In_2O_3$, $SnO_2$, ITO, and so forth. The conductive oxides (especially ITO) can be used to particular advantage because it is a material that has high optical transmissivity of visible light (in the visible band), for example, 60% or more, 70% or more, 75% or more, or 80% or more, and has a relatively high dielectric constant.

Second Embodiment

Figure 3:
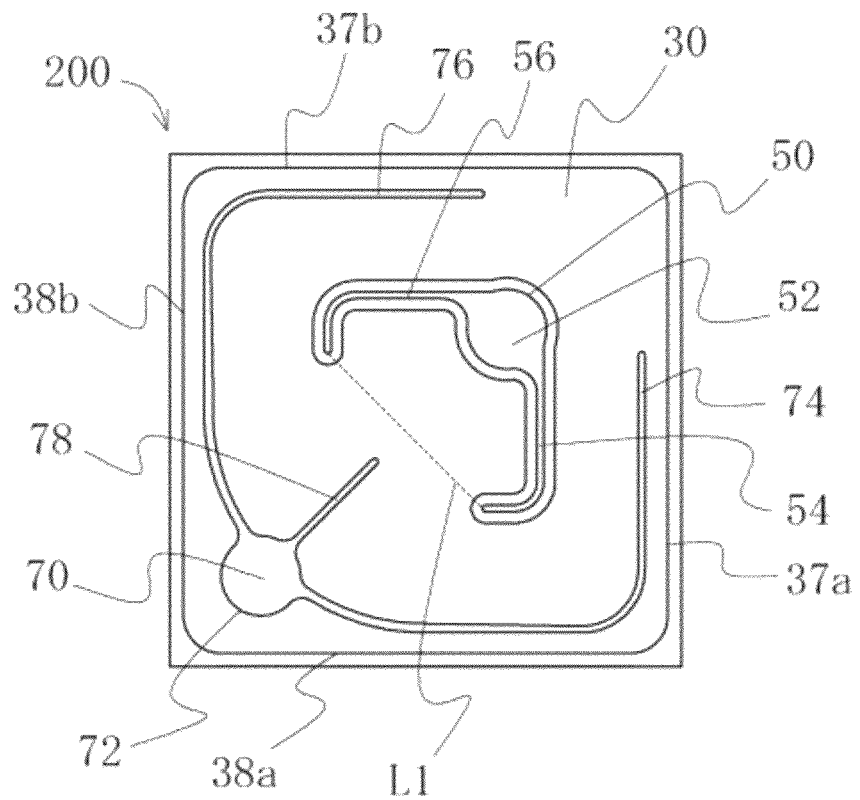
FIG. 3 is a plan view schematically illustrating the light emitting element pertaining to a second embodiment.

FIG. 3 is a plan view schematically illustrating the light emitting element pertaining to a second embodiment.

The light emitting element pertaining to a second embodiment has substantially the same structure as that in the first embodiment, except that the electrode extended portion shape is different. Portions of the structure that are the same may not be described again.

A light emitting element 200 pertaining to this embodiment comprises at least a substrate 10, a semiconductor layer 30, a first electrode 50, and a second electrode 70.

The first electrode 50 and the second electrode 70 are disposed opposite each other in the diagonal direction of the semiconductor layer 30, which has a substantially rectangular shape in top view.

The first electrode 50 has a first external connector 52 and a first extended portion 54 and second extended portion 56 that extend from the first external connector 52. The first external connector 52 is disposed near the corner (on the inside) of the semiconductor layer 30. The first extended portion 54 extends substantially parallel to one side face 37a that constitutes the corner of the semiconductor layer 30 where the first external connector 52 is disposed. The second extended portion 56 extends substantially parallel to the other side face 37b that constitutes the corner of the semiconductor layer 30 where the first external connector 52 is disposed.

The second electrode 70 has a second external connector 72 and a third extended portion 74, a fourth extended portion 76, and a fifth extended portion 78 that extend from the second external connector 72.

The second external connector 72 is disposed near the corner (on the inside) of the semiconductor layer 30.

The third extended portion 74 extends substantially parallel to one side face 38a that constitutes the corner of the semiconductor layer 30 where the second external connector 72 is disposed, and extends the outside beyond the first extended portion 54 substantially parallel to the first extended portion 54.

The fourth extended portion 76 extends substantially parallel to the other side face 38b that constitutes the corner of the semiconductor layer 30 where the second external connector 72 is disposed, and extends the outside beyond the second extended portion 56 substantially parallel to the second extended portion 56.

The fifth extended portion 78 extends the area between the third extended portion 74 and the fourth extended portion 76 linearly toward the first external connector 52. The distal end of the fifth extended portion 78 is disposed more to the second external connector 72 side than the line $L_1$ that links the distal ends of the first extended portion 54 and the second extended portion 56.

Consequently, there is less excessive concentration of current between the fifth extended portion 78 and the region bounded by the first extended portion 54 and second extended portion 56, and part of the restricted current can spread out between the first extended portion 54 and the third extended portion 74, and between the second extended portion 56 and the fourth extended portion 76.

The distal ends of the first extended portion 54 and the second extended portion 56 each curve to the second external connector 72 side, and the curved distal ends respectively extend substantially parallel to the side faces 38a and 38b that constitute the corner of the semiconductor layer 30 where the second external connector 72 is disposed.

Consequently, the portions that are opposite and substantially parallel between the extended portions 54 and 56 of the first electrode and the extended portions 74 and 76 of the second electrode can be increased, so the current can be spread out more uniformly. Also, since the third extended portion 74 and the fourth extended portion 76 are not disposed in the direction in which the distal ends of the first extended portion 54 and the second extended portion 56 extend (that is, they curve), this lessens the concentration of current that occurs relatively readily between these.

With the light emitting element 200 pertaining to the second embodiment and having the constitution discussed above, the distribution of current density between the first electrode 50 and the second electrode 70 can be made more uniform.

Third Embodiment

Figure 12A:
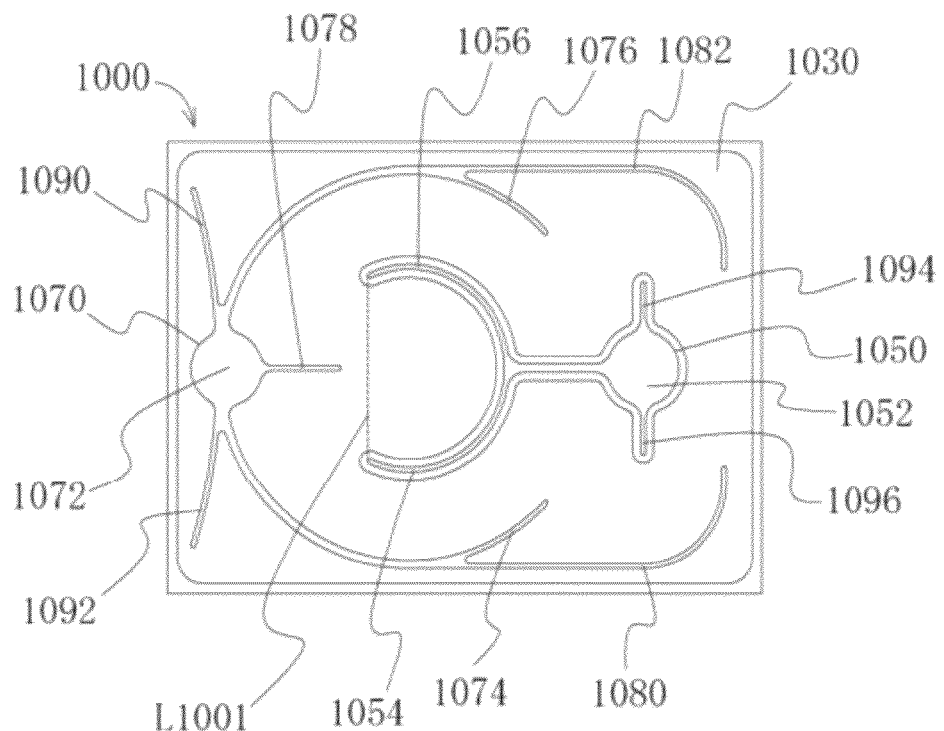
FIG. 12 is a diagram related to the light emitting element pertaining to a third embodiment, in which (a) is a plan view schematically illustrating the light emitting element pertaining to the third embodiment, and (b) is a plan view of the distribution of current density of the light emitting element pertaining to the third embodiment.
Figure 12B:
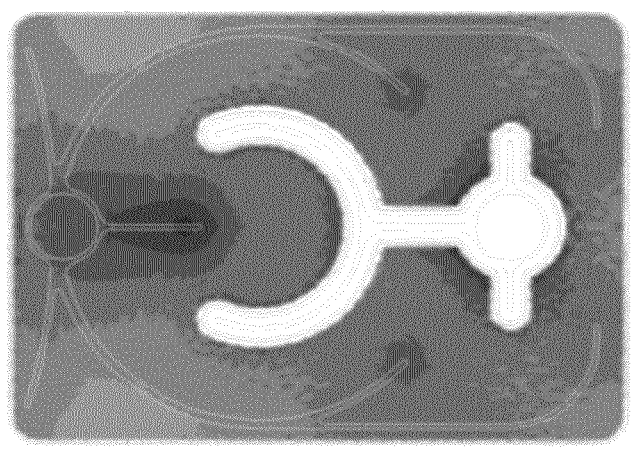
Figure 12B:

FIG. 12 is a diagram related to the light emitting element pertaining to a third embodiment, in which (a) is a plan view schematically illustrating the light emitting element pertaining to the third embodiment, and (b) is a plan view of the distribution of current density of the light emitting element pertaining to the third embodiment, with the bar on the right indicating current density, which increases from bottom to top (indicated by darker shading).

The light emitting element pertaining to a third embodiment, which has a substantially rectangular shape in top view, has substantially the same structure as that in the first embodiment, except that the electrode extended portion shape is different. Portions of the structure that are the same may not be described again.

The light emitting element 1000 pertaining to this embodiment comprises at least a substrate, a semiconductor layer 1030, a first electrode 1050, and a second electrode 1070.

The first electrode 1050 has at least a first external connector 1052 and a first extended portion 1054 and second extended portion 1056 that extend from the first external connector 1052 and are provided so that their distal ends branch off.

The second electrode 1070 has at least a second external connector 1072 and a third extended portion 1074, a fourth extended portion 1076, and a fifth extended portion 1078 that extend from the second external connector 1072.

The first external connector 1052 and the second external connector 1072 are disposed opposite each other in the lengthwise direction of the semiconductor layer 1030, which has a substantially rectangular shape in plan view (disposed on the opposing short-sides of the semiconductor layer).

The third extended portion 1074 extends the outside beyond the first extended portion 1054 along the first extended portion 1054.

The fourth extended portion 1076 extends the outside beyond the second extended portion 1056 along the second extended portion 1056.

The fifth extended portion 1078 extends the area between the third extended portion 1074 and the fourth extended portion 1076 to the first external connector 1052 side. This fifth extended portion 1078 is on the second external connector 1072 side of a line $L_{1001}$ that links a point on the first extended portion 1054 at the position closest to the second external connector 1072 (the distal end of the first extended portion) and a point on the second extended portion 1056 at the position closest to the second external connector 1072 (the distal end of the second extended portion).

Also, the third extended portion 1074 and the fourth extended portion 1076 have a sixth extended portion 1080 and a seventh extended portion 1082 that branch off to the outside and extend along the side faces of the semiconductor layer 1030 so as to surround the first external connector 1052.

The first external connector 1052 has an eighth extended portion 1094 and a ninth extended portion 1096 that extend in the short-side direction of the semiconductor layer 1030, so current can be uniformly spread out over the entire semiconductor layer, which has a substantially rectangular shape. Further, the first external connector 1052 preferably is disposed within a region bounded by lines that link the distal ends of the third extended portion 1074, the fourth extended portion 1076, the sixth extended portion 1080, and the seventh extended portion 1082, which allows the current that tends to concentrate in the first external connector 1030 to be spread out in the surrounding area.

The second external connector 1072 has a tenth extended portion 1090 and an eleventh extended portion 1092. The tenth extended portion 1090 and eleventh extended portion 1092 extend toward the corners of the semiconductor layer 1030 near the second external connector 1072, which allows the current to spread out to the corners of the semiconductor layer 1030 where current tends to be lacking.

With the light emitting element 1000 pertaining to the third embodiment and having the constitution discussed above, the distribution of current density between the first electrode 1050 and the second electrode 1070 can be made more uniform as shown in FIG. 12(b).

WORKING EXAMPLES

An experimental example that confirms the effect provided by the light emitting element pertaining to the present invention will now be described in detail through reference to FIGS. 4 to 11. In this experimental example, current was supplied to a plurality of light emitting elements with different electrode layouts, and the distribution of the current density in the light emitting elements was observed. The differences in the current density and forward voltage (Vf) of the various light emitting elements from the distribution of current density among the light emitting elements were then compared.

The current density distribution and the forward voltage (Vf) of the light emitting elements were observed and analyzed by simulation software using a finite element method.

(a) in each of FIGS. 4 to 9 shows the layout of the electrodes of the light emitting elements used in the experiment, while (b) in each of FIGS. 4 to 9 shows the result of observing the current density of the light emitting elements.

The bar on the right of figures (b) in each of FIGS. 4 to 9 indicates current density, which increases from bottom to top (indicated by darker shading).

Comparative Example 1

Figure 4A:
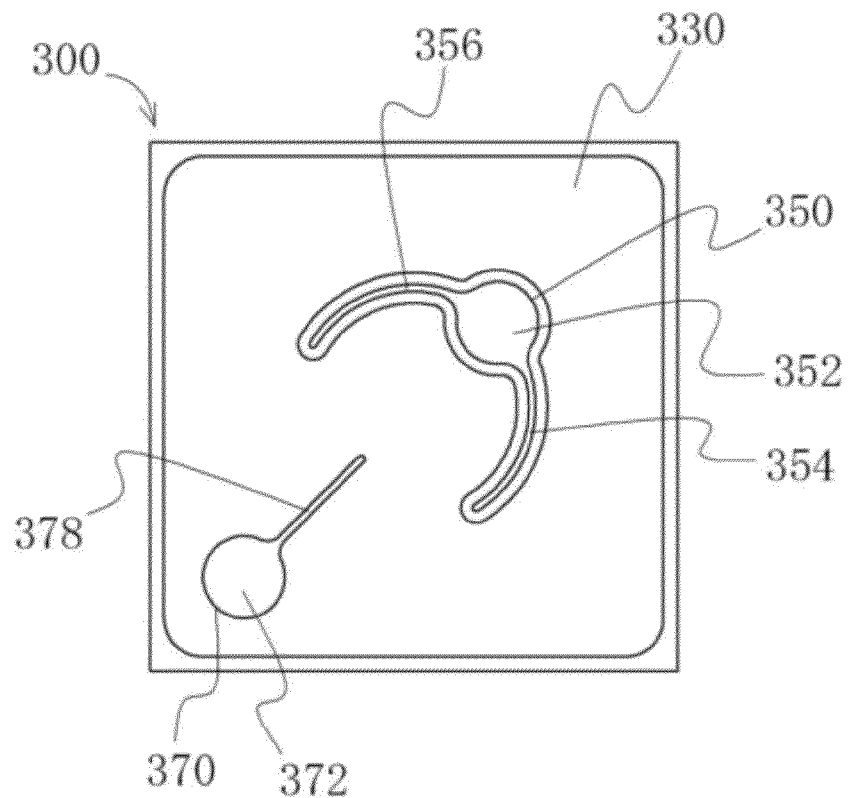
FIG. 4 is a diagram related to the light emitting element pertaining to a comparative example 1, in which (a) is a plan view schematically illustrating the light emitting element pertaining to the comparative example 1, and (b) is a plan view of the distribution of current density of the light emitting element pertaining to the comparative example 1.
Figure 4B:

As shown in FIG. 4a, with the light emitting element 300 pertaining to Comparative Example 1, the first electrode 350 has a first external connector 352 and a first extended portion 354 and second extended portion 356 that extend from the first external connector 352. An external connector 372 of the second electrode 370 (second external connector) has no third extended portion and fourth extended portion, and a fifth extended portion 378 extends linearly from the second external connector 372, where current tends to concentrate relatively readily, linearly to the external connector 352 side of the first electrode 350 (first external connector). Thus, as shown in FIG. 4b, current ends up flowing excessively between the first external connector 352 and the second external connector 372, and there is a decrease in the current density near the side faces of the semiconductor layer 330 on the first external connector 352 side. Therefore, with the electrode shape and layout shown in FIG. 4a, it can be seen that there is a large bias in the distribution of current density.

Comparative Example 2

Figure 5A:
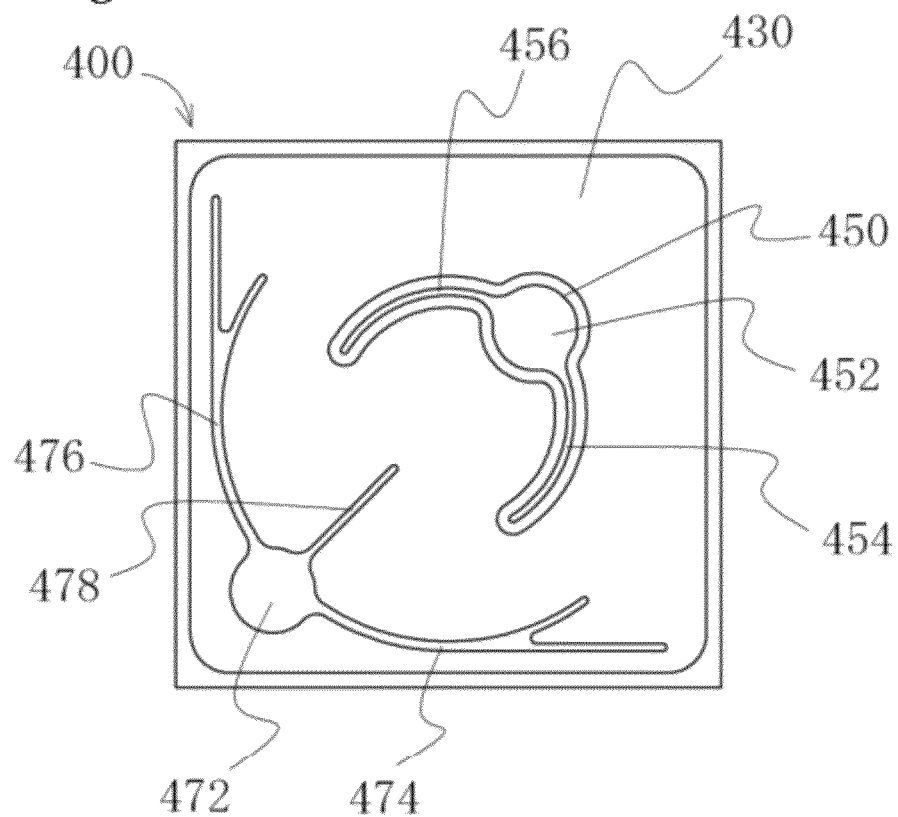
FIG. 5 is a diagram related to the light emitting element pertaining to a comparative example 2, in which (a) is a plan view schematically illustrating the light emitting element pertaining to the comparative example 2, and (b) is a plan view of the distribution of current density of the light emitting element pertaining to the comparative example 2.
Figure 5B:
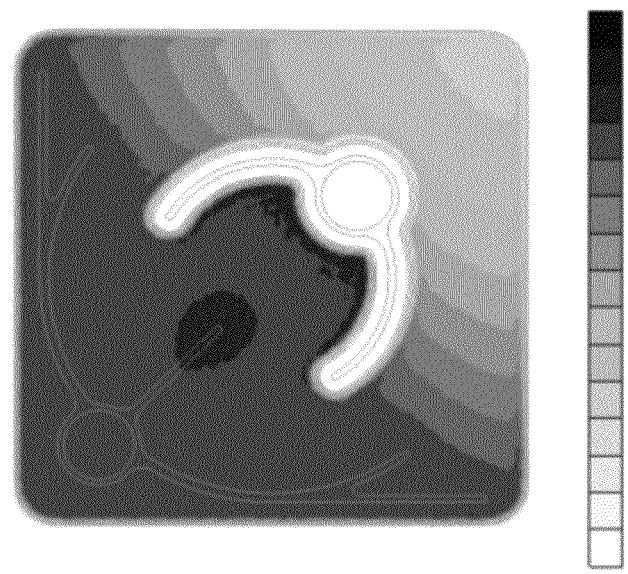

As shown in FIG. 5a, with the light emitting element 400 pertaining to Comparative Example 2, a third extended portion 474 and a fourth extended portion 476 that extend from the external connector 472 of the second electrode (second external connector) do not extend along a first extended portion 454 and second extended portion 456 that extend from the external connector 452 of a first electrode 450 (first external connector). Accordingly, as shown in FIG. 5b, current concentrates on the second external connector 472 side, and does not spread out to the first external connector 452 side, so there is a decrease in current density around the corners of the semiconductor layer 430, and particularly on the first external connector 452 side. Therefore, with the electrode shape and layout shown in FIG. 5a, it can be seen that there is a large bias in the distribution of current density.

Comparative Example 3

Figure 6A:
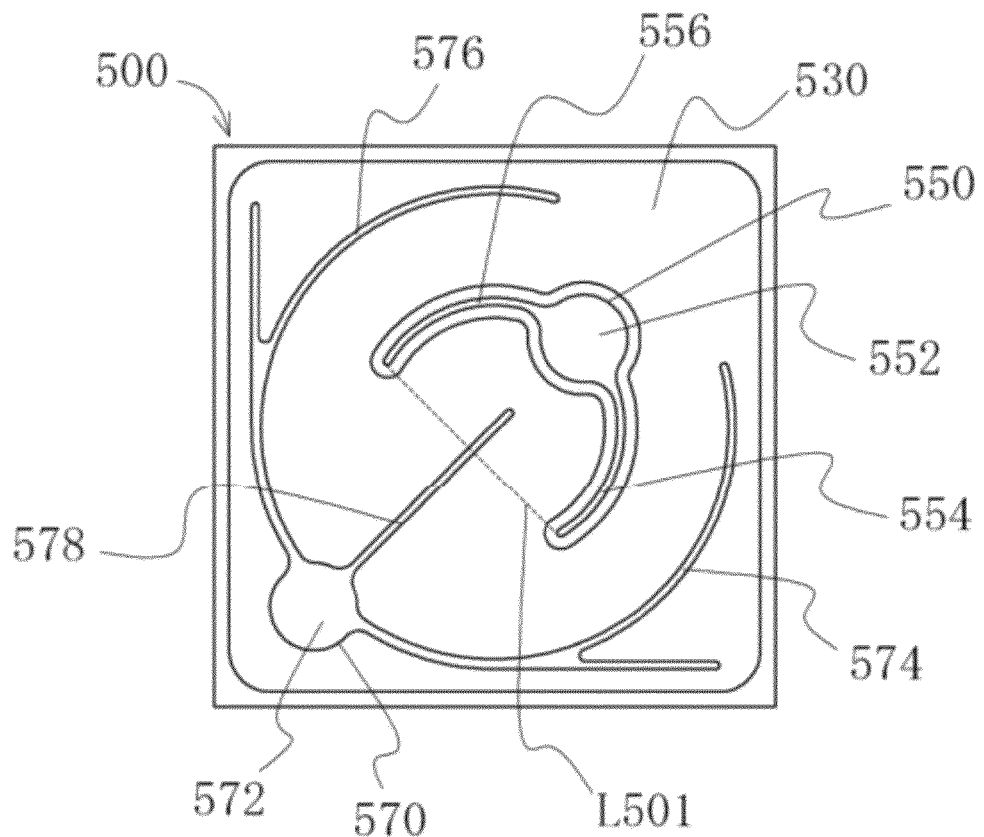
FIG. 6 is a diagram related to the light emitting element pertaining to a comparative example 3, in which (a) is a plan view schematically illustrating the light emitting element pertaining to the comparative example 3, and (b) is a plan view of the distribution of current density of the light emitting element pertaining to the comparative example 2.
Figure 6B:
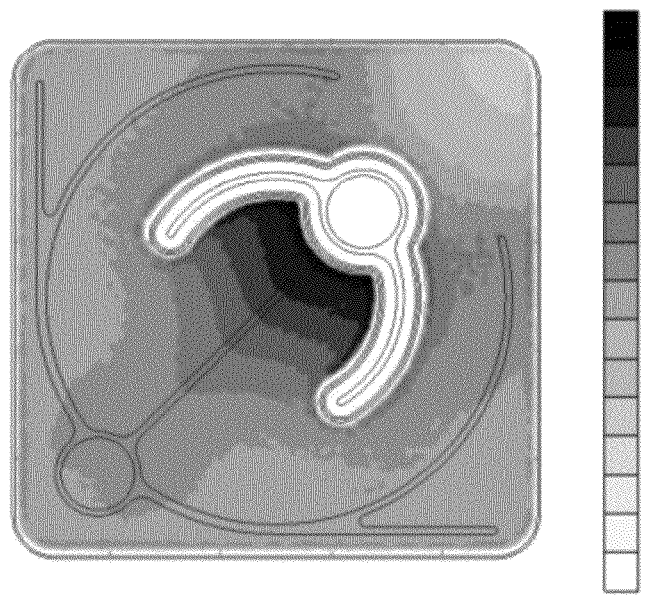

As shown in FIG. 6a, with the light emitting element 500 pertaining to Comparative Example 3, a third extended portion 574 and a fourth extended portion 576 that extend from the external connector 572 of the second electrode 570 (second external connector) extend so as to be respectively opposite a first extended portion 554 and a second extended portion 556, which extend from the external connector 552 of the first electrode 550 (first external connector). However, the distal end of a fifth extended portion 578 that extends linearly from the second external connector 572 is disposed more to the first external connector 552 side than a line $L_{501}$ that links a point on the first extended portion 554 at the position closest to the second external connector 572 (the distal end of the first extended portion), and a point on the second extended portion 556 at the position closest to the second external connector 572 (the distal end of the second extended portion). Accordingly, as shown in FIG. 6b, current is excessively concentrated between the distal end of the fifth extended portion 578 and the first external connector 552, the first extended portion 554, and the second extended portion 556 disposed so as to surround the distal end of the fifth extended portion 578. Therefore, with the electrode shape and layout shown in FIG. 6a, it can be seen that there is a large bias in the distribution of current density in the semiconductor layer 530.

Working Example 1

Figure 7A:
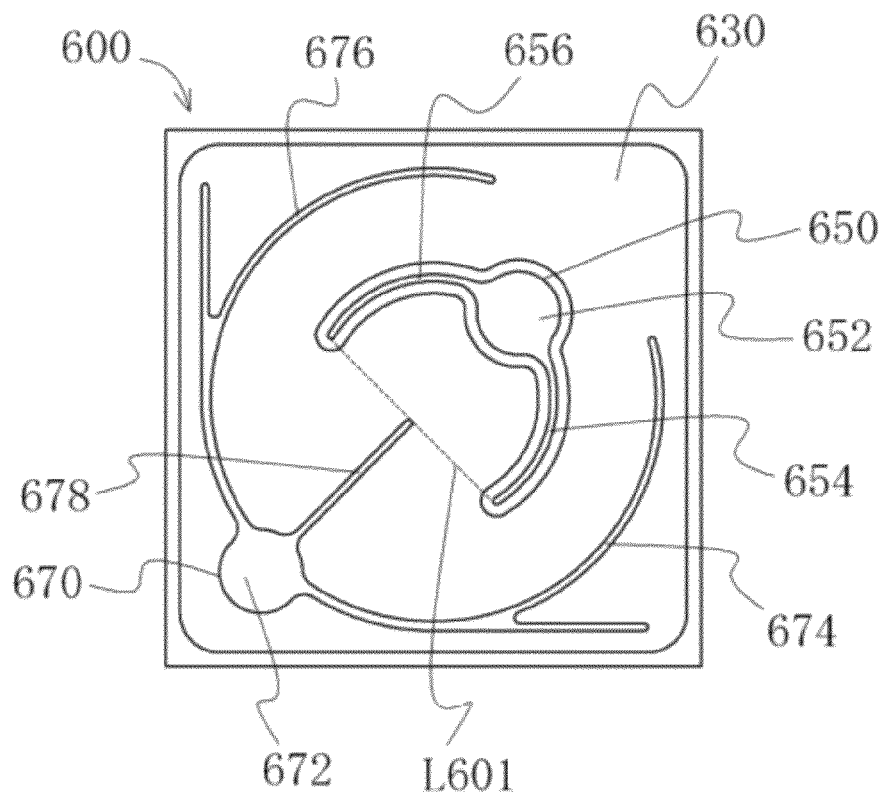
FIG. 7 is a diagram related to the light emitting element pertaining to a working example 1, in which (a) is a plan view schematically illustrating the light emitting element pertaining to the working example 1, and (b) is a plan view of the distribution of current density of the light emitting element pertaining to the working example 1.

As shown in FIG. 7a, with the light emitting element 600 pertaining to Working Example 1, a third extended portion 674 and a fourth extended portion 676 that extend from an external connector 672 of the second electrode 670 (second external connector) extend so as to be respectively opposite a first extended portion 654 and a second extended portion 656, which extend from the external connector 652 of the first electrode 650 (first external connector). Furthermore, the distal end of a fifth extended portion 678 that extends linearly from the second external connector 672 is disposed on a line $L_{601}$ that links a point on the first extended portion 654 at the position closest to the second external connector 672 (the distal end of the first extended portion), and a point on the second extended portion 656 at the position closest to the second external connector 672 (the distal end of the second extended portion).

Figure 7B:
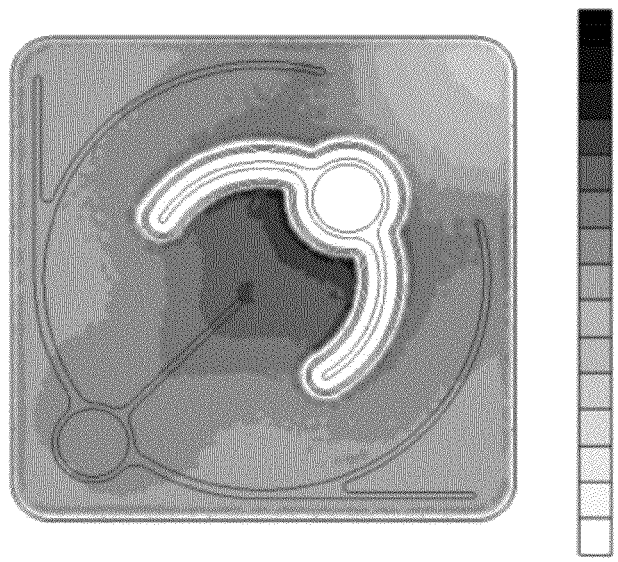

Accordingly, as shown in FIG. 7b, there is less excessive concentration of current between the distal end of the fifth extended portion 678 and the region bounded by the first extended portion 654, the second extended portion 656, and the first external connector 652, and part of the restricted current can spread out between the first extended portion 654 and the third extended portion 674, and between the second extended portion 656 and the fourth extended portion 676. Therefore, with the electrode shape and layout shown in FIG. 7a, it can be seen that the distribution of current density in the semiconductor layer 630 can be made more uniform, so uniform light emission can be obtained.

Working Example 2

Figure 8A:
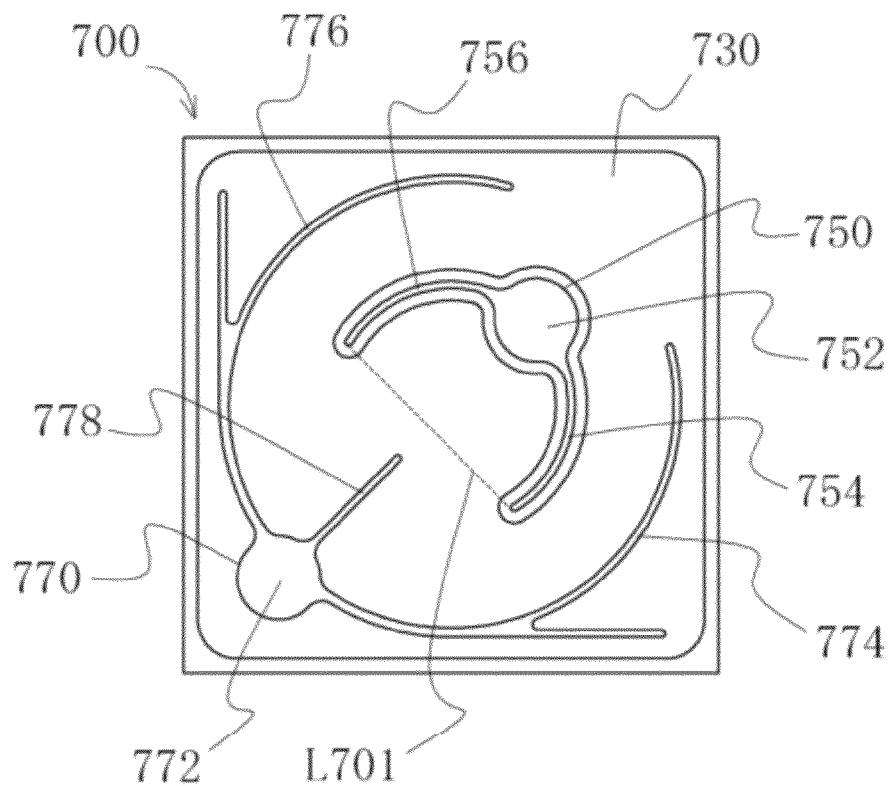
FIG. 8 is a diagram related to the light emitting element pertaining to a working example 2, in which (a) is a plan view schematically illustrating the light emitting element pertaining to the working example 2, and (b) is a plan view of the distribution of current density of the light emitting element pertaining to the working example 2.

As shown in FIG. 8a, the light emitting element 700 pertaining to Working Example 2 has the same constitution as the light emitting element 600 pertaining to Working Example 1 above, but the distal end of a fifth extended portion 778 is disposed more to the second external connector 772 side as compared to the fifth extended portion 678 of the light emitting element 600 pertaining to Working Example 1. That is, the distal end of the fifth extended portion 778 is disposed more on the second external connector 772 side than a line $L_{701}$ that links a point on the first extended portion 754 of the first electrode 750 at the position closest to the second external connector 772 (the distal end of the first extended portion), and a point on the second extended portion 756 at the position closest to the second external connector 772 (the distal end of the second extended portion).

Figure 8B:
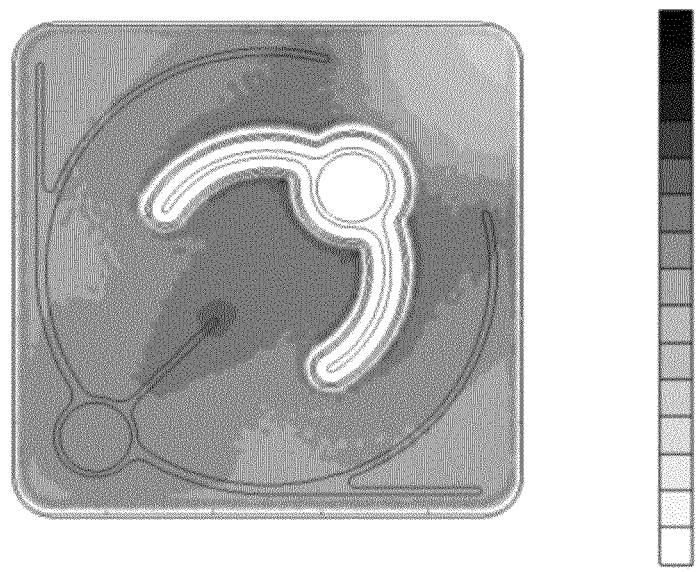

Accordingly, as shown in FIG. 8b, there is even less excessive concentration of current between the distal end of the fifth extended portion 778 and the region bounded by the first extended portion 754, the second extended portion 756, and the first external connector 752, and part of the restricted current can spread out between the first extended portion 754 and the third extended portion 774, and between the second extended portion 756 and the fourth extended portion 776. Therefore, with the electrode shape and layout shown in FIG. 8a, it can be seen that the distribution of current density in the semiconductor layer 730 can be made more uniform, so uniform light emission can be obtained. The light emitting element 700 pertaining to Working Example 2 is the same as the light emitting element 100 pertaining to the first embodiment given above.

Working Example 3

Figure 9A:
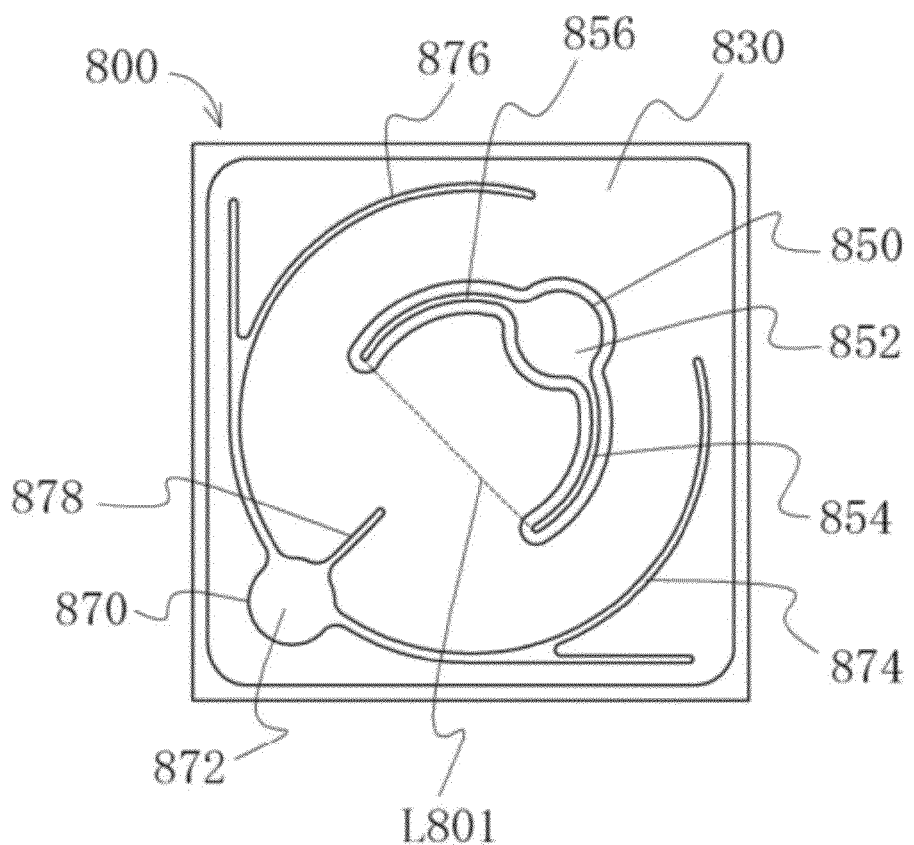
FIG. 9 is a diagram related to the light emitting element pertaining to a working example 3, in which (a) is a plan view schematically illustrating the light emitting element pertaining to the working example 3, and (b) is a plan view of the distribution of current density of the light emitting element pertaining to the working example 3.

As shown in FIG. 9a, the light emitting element 800 pertaining to Working Example 3 has the same constitution as the light emitting element 700 pertaining to Working Example 2 above, but the distal end of a fifth extended portion 878 is disposed even more to the second external connector 872 side as compared to the fifth extended portion 778 of the light emitting element 700 pertaining to Working Example 2.

Figure 9B:
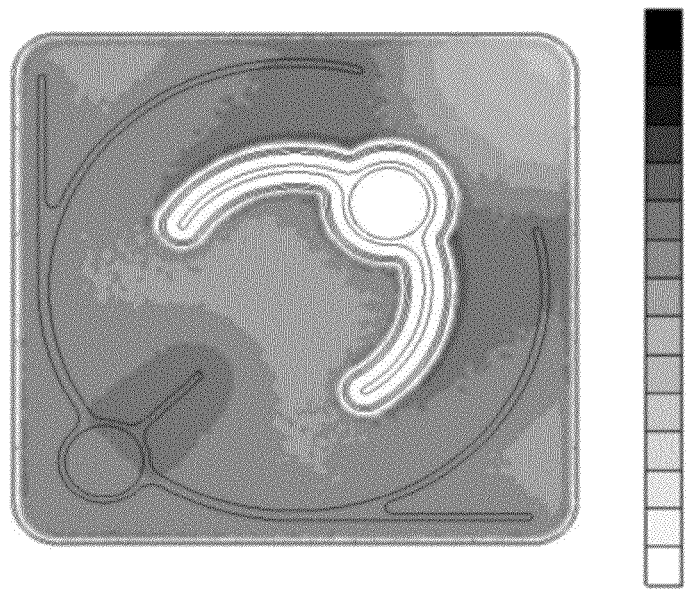

Accordingly, as shown in FIG. 9b, there is even less excessive concentration of current between the distal end of the fifth extended portion 878 of the second electrode 870 and the region bounded by the first extended portion 854, the second extended portion 856, and the first external connector 852 of the first electrode 850, and part of the restricted current can spread out between the first extended portion 854 and the third extended portion 874, and between the second extended portion 856 and the fourth extended portion 876. Therefore, with the electrode shape and layout shown in FIG. 9a, it can be seen that the distribution of current density in the semiconductor layer 830 can be made more uniform, so uniform light emission can be obtained.

Working Example 4

Figure 10A:
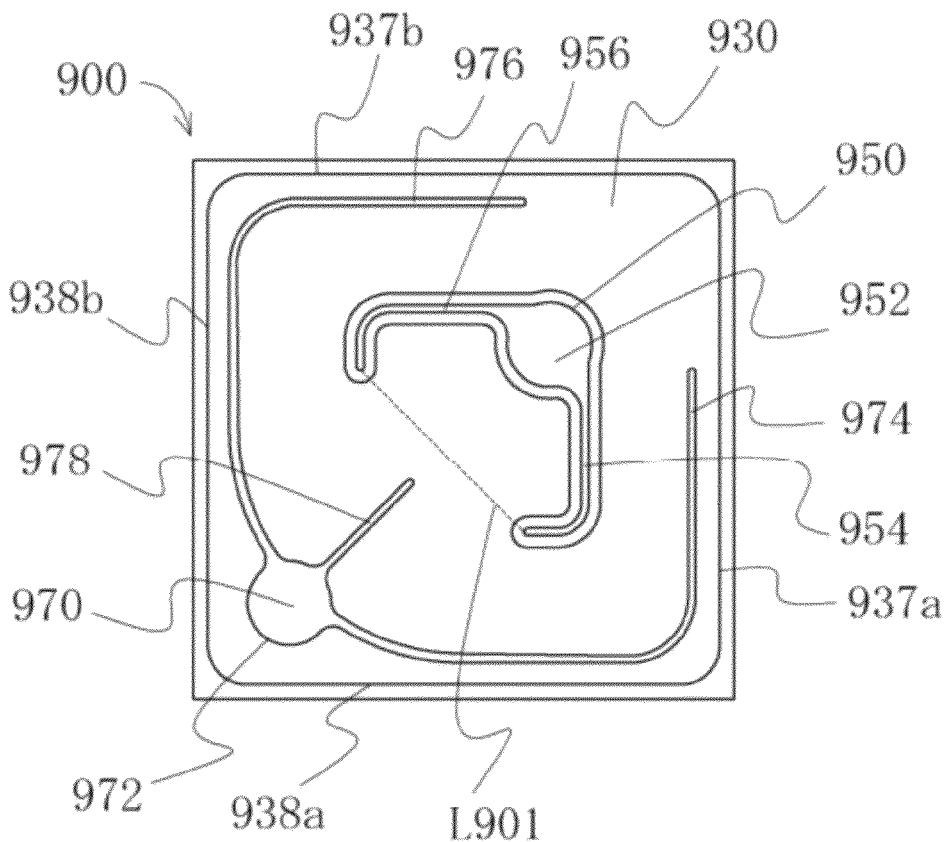
FIG. 10 is a diagram related to the light emitting element pertaining to a working example 4, in which (a) is a plan view schematically illustrating the light emitting element pertaining to the working example 4, and (b) is a plan view of the distribution of current density of the light emitting element pertaining to the working example 4.

As shown in FIG. 10a, with the light emitting element pertaining to Working Example 4, a first extended portion 954 and a second extended portion 956 that extend from the external connector 952 of the first electrode 950 (first external connector) extend substantially parallel to side faces 937a, 937b, 938a, and 938b of the semiconductor layer, and a third extended portion 974 and a fourth extended portion 976 that extend from the external connector 972 of the second electrode 970 (second external connector) extend the outside beyond the first extended portion 954 and the second extended portion 956 substantially parallel to the first extended portion 954 and the second extended portion 956. Further, the distal end of a fifth extended portion 978 that extends linearly from the second external connector 972 is disposed more on the second external connector 972 side than a line $L_{901}$ that links a point on the first extended portion 954 at the position closest to the second external connector 972 (the distal end of the first extended portion), and a point on the second extended portion 956 at the position closest to the second external connector 972 (the distal end of the second extended portion).

Figure 10B:
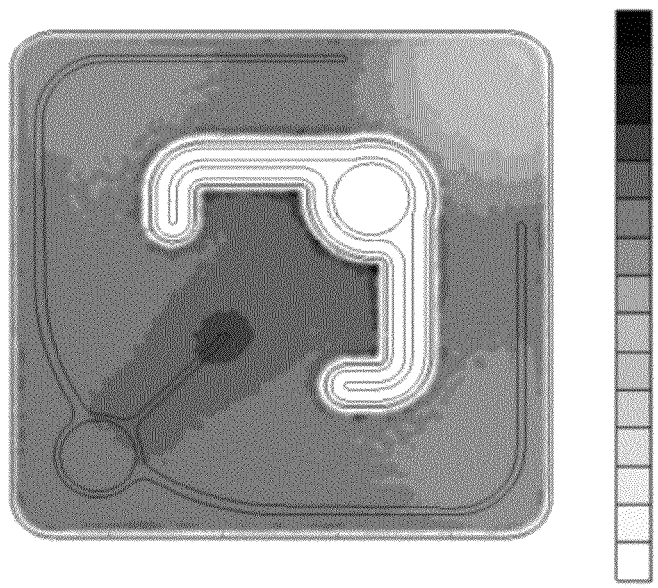

Accordingly, as shown in FIG. 10b, there is less excessive concentration of current between the distal end of the fifth extended portion 978 and the region bounded by the first extended portion 954, the second extended portion 956, and the first external connector 952, and part of the restricted current can spread out between the first extended portion 954 and the third extended portion 974, and between the second extended portion 956 and the fourth extended portion 976. Therefore, with the electrode shape and layout shown in FIG. 10a, it can be seen that the distribution of current density can be made more uniform, so uniform light emission can be obtained. The light emitting element 900 pertaining to Working Example 4 is the same as the light emitting element 200 pertaining to the second embodiment given above.

Figure 11A:
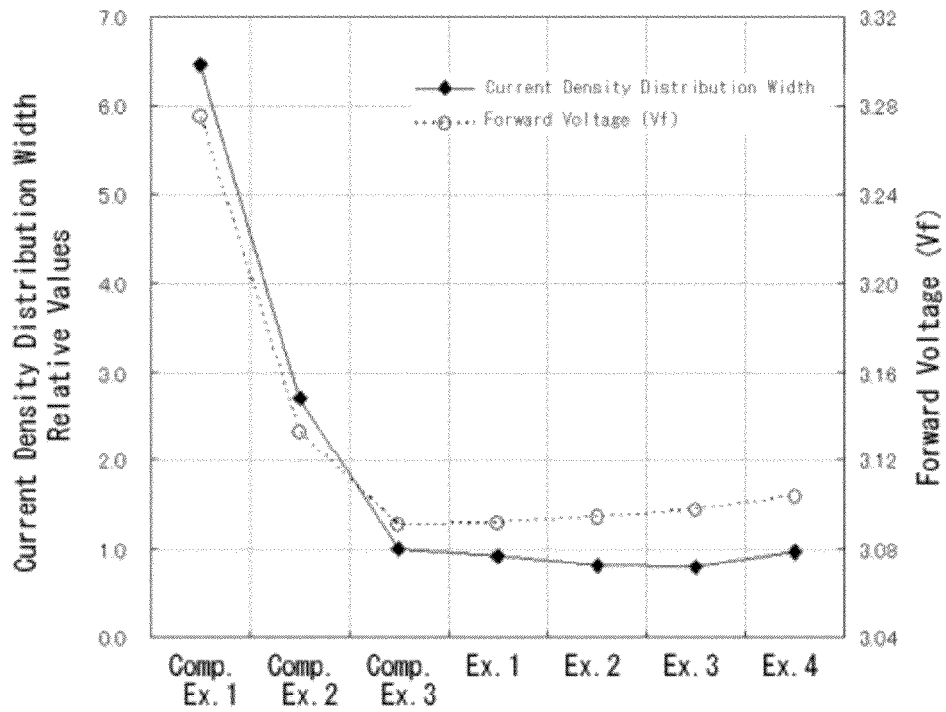
FIG. 11 is a chart showing simulation results of forward voltage (Vf) and the relative values for current density distribution width in the light emitting elements pertaining to Comparative Examples and Working Examples, (b) is a chart comparing only the relative values for current density distribution width on Comparative Example 3 and Working Examples, 1 to 3, shown in (a)
Figure 11B:
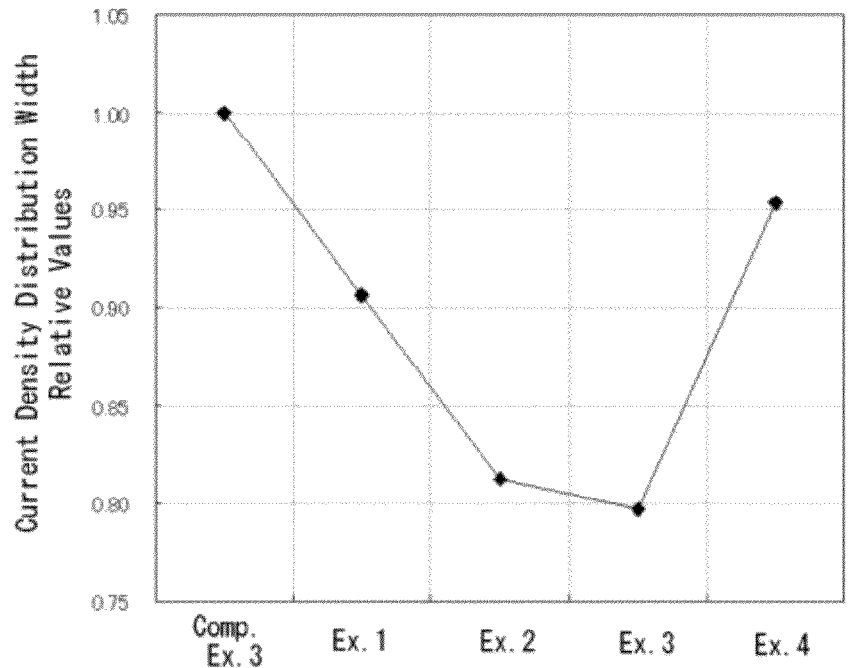

FIG. 11 shows the values for forward voltage (Vf) and the relative values for current density distribution width in the light emitting elements pertaining to Comparative Examples 1 to 3 and Working Examples 1 to 4. FIG. 11b is a graph that compares just the relative values for current density distribution width in Comparative Example 3 and Working Examples 1 to 4 shown in FIG. 11a.

The "relative values" here are values indicating the difference in current density distribution of the various light emitting elements using Comparative Example 3 as a reference. The current density at the maximum frequency in a histogram of the current density distribution for the various light emitting elements is used as a reference, the difference is calculated between the current density at which the frequency is 5% of the maximum frequency on the side greater than the reference, and the current density at which the frequency is 5% of the maximum frequency on the side less than the reference, and the value calculated for each light emitting element is divided by the value for Comparative Example 3 to obtain a relative value. A comparison of these relative values makes it easy to tell whether the difference in the current density distribution for each light emitting element is greater or less than in Comparative Example 3.

In these working examples, as shown in FIG. 11, the relative values for the light emitting elements 600, 700, 800, and 900 pertaining to Working Examples 1 to 4 are lower than the relative value for the light emitting element 500 pertaining to Comparative Example 3 that served as a reference, and of these, the relative value for the light emitting element 800 pertaining to Working Example 3 is the lowest. The next lowest relative value was for the light emitting element 700 pertaining to Working Example 2, and then for the light emitting element 600 pertaining to Working Example 1. It can be seen that the light emitting element 700 pertaining to Working Example 2 also had a Vf value that was kept relatively low.

Meanwhile, the light emitting elements 300 and 400 pertaining to Comparative Examples 1 and 2 had relative values and Vf values that were far higher than those of the light emitting elements 600, 700, 800, and 900 pertaining to Working Examples 1 to 4 and the light emitting element 500 pertaining to Comparative Example 3 that served as a reference.

Therefore, with the electrode shape and layout of the light emitting element 800 pertaining to Working Example 3, the difference in current density in the semiconductor layer can be reduced the most, and when the Vf value is also taken into account, it can be seen that the electrode shape and layout of the light emitting element 700 pertaining to Working Example 2 are the best.

With the light emitting element pertaining to the present invention [1] as described above, part of the current flow that is concentrated between the first external connector and the second external connector can be spread out over the areas where current tends to be lacking.

The present application includes inventions [2] to [8].

[2] The light emitting element of [1], wherein the first extended portion and second extended portion are disposed in the form of arcs that are concentric with the third extended portion and fourth extended portion.

Consequently, the current flowing between the first extended portion and the third extended portion, and between the second extended portion and the fourth extended portion can be made more uniform.

[3] The light emitting element of [1] or [2], wherein in order from a center of the concentric arcs, on a line $L_2$ linking the first extended portion and the third extended portion, a distance $c_1$ from the center of the concentric arcs to the first extended portion is the same as or longer than a distance $d_1$ from the first extended portion to the third extended portion, and in order from the center of the concentric arcs, on a line $L_3$ linking the second extended portion and the fourth extended portion, a distance $c_2$ from the center of the concentric arcs to the second extended portion is the same as or longer than a distance $d_2$ from the second extended portion to the fourth extended portion.

Consequently, the current flow that tends to be concentrated between the first external connector and the second external connector, and particularly near the center of the concentric arcs, can even more easily spread out between the first extended portion and the third extended portion, and between the second extended portion and the fourth extended portion.

[4] The light emitting element of any one of [1] to [3], wherein the semiconductor layer has an n-side semiconductor layer, and a p-side semiconductor layer that is laminated on the n-side semiconductor layer, a first external connector is provided on the n-side semiconductor layer, and a second external connector is provided on the p-side semiconductor layer, respectively, a distance $a_1$ from the second external connector to a point on the first extended portion at the closest position to the second external connector is longer than a distance $b_1$ from the first external connector to a point on the third extended portion at the closest position to the first external connector, and a distance $a_2$ from the second external connector to a point on the second extended portion at the closest position to the second external connector is longer than a distance $b_2$ from the first external connector to a point on the fourth extended portion at the closest position to the first external connector.

Consequently, the current flowing between the first extended portion or second extended portion and the second external connector of the p-side electrode, where the current tends to be more concentrated on the periphery region than at the first external connector of the n-side electrode, can more easily spread out between the first external connector of the n-side electrode and the third extended portion or fourth extended portion.

[5] The light emitting element of any one of [1] to [4], wherein the widths of the third extended portion and the fourth extended portion are such that the widths on the second external connector side are greater than the widths on the distal end side.

Consequently, at the third extended portion and the fourth extended portion, the sheet resistance on the second external connector side can be decreased, and the current can more easily spread out to the distal end side.

[6] The light emitting element of any one of [1] to [5], wherein the first external connector is bounded by the lines $L_4$ that link the point on the third extended portion, the point on the fourth extended portion, and the point on the fifth extended portion that are farthest from the second external connector.

Accordingly, the first external connector, in which the flow of current tends to be relatively concentrated, is disposed in a region where current tends to be lacking and the distance from the second external connector is farther, and this compensates for the lack of current.

[7] The light emitting element of any one of [1] to [6], wherein the semiconductor layer has a substantially rectangular shape in top view, the second external connector is disposed at a corner of the semiconductor layer having the substantially rectangular shape, and has a sixth extended portion that branches off to the outside from the third extended portion and extends to a corner adjacent to the corner where the second external connector is disposed, and a seventh extended portion that branches off to the outside from the fourth extended portion and extends to a corner adjacent to the corner where the second external connector is disposed.

Consequently, current can also be spread out to the corner of the semiconductor layer where the external connectors and are not disposed and where current tends to be lacking.

The light emitting element of any one of [1] to [7], wherein the semiconductor layer has a substantially rectangular shape in top view, the first external connector and the second external connector are disposed opposite each other in the lengthwise direction of the semiconductor layer, the first extended portion and second extended portion that extend from the first external connector are provided so that their distal ends branch off.

Consequently, current can be uniformly spread out over the entire semiconductor layer, which has a substantially rectangular shape.

While only selected embodiments and Examples have been chosen to illustrate the present invention, the foregoing descriptions of the embodiments according to the present invention are provided for illustration only, and not for the purpose of limiting the invention as defined by the appended claims and their equivalents. It will be apparent to those skilled in the art from this disclosure that various changes and modifications can be made herein without departing from the scope of the invention as defined in the appended claims.

The light emitting element of the present invention can be used for general lighting, as well as for liquid crystal backlights, automotive headlights, signal devices, large television sets, and various other kinds of light sources.

What is claimed is:

1. A light emitting element comprising a first electrode and a second electrode provided on a semiconductor layer;
    the first electrode has a first external connector and a first extended portion and second extended portion that extend from the first external connector,
    the second electrode has a second external connector, and a third extended portion, a fourth extended portion, and a fifth extended portion that extend from the second external connector,
    the third extended portion extends along the first extended portion and farther outside than the first extended portion,
    the fourth extended portion extends along the second extended portion and farther outside than the second extended portion, and
    the fifth extended portion extends an area between the third extended portion and the fourth extended portion to the first external connector side, and a free end of the fifth extended portion is either on a line that links a point on the first extended portion at the position closest to the second external connector and a point on the second extended portion at the position closest to the second external connector, or closer to the second external connector side than the line.

2. The light emitting element according to claim 1, wherein the first extended portion and second extended portion are disposed in the form of arcs that are concentric with the third extended portion and fourth extended portion.

3. The light emitting element according to claim 2, wherein in order from a center of the concentric arcs, on a line $L_2$ linking the first extended portion and the third extended portion, a distance $c_1$ from the center of the concentric arcs to the first extended portion is the same as or longer than a distance $d_1$ from the first extended portion to the third extended portion, and
    in order from the center of the concentric arcs, on a line $L_3$ linking the second extended portion and the fourth extended portion, a distance $c_2$ from the center of the concentric arcs to the second extended portion is the same as or longer than a distance $d_2$ from the second extended portion to the fourth extended portion.

4. The light emitting element according to claim 1, wherein the semiconductor layer has an n-side semiconductor layer, and a p-side semiconductor layer that is laminated on the n-side semiconductor layer, a first external connector is provided on the n-side semiconductor layer, and a second external connector is provided on the p-side semiconductor layer, respectively, a distance $a_1$ from the second external connector to a point on the first extended portion at the closest position to the second external connector is longer than a distance $b_1$ from the first external connector to a point on the third extended portion at the closest position to the first external connector, and a distance $a_2$ from the second external connector to a point on the second extended portion at the closest position to the second external connector is longer than a distance $b_2$ from the first external connector to a point on the fourth extended portion at the closest position to the first external connector.

5. The light emitting element according to claim 1, wherein the widths of the third extended portion and the fourth extended portion are such that the widths on the second external connector side are greater than the widths on the distal end side.

6. The light emitting element according to claim 1, wherein the first external connector is bounded by lines $L_4$ that link the point on the third extended portion, the point on the fourth extended portion, and the point on the fifth extended portion that are farthest from the second external connector.

7. The light emitting element according to claim 1, wherein the semiconductor layer has a substantially rectangular shape in top view, the second external connector is disposed at a corner of the semiconductor layer having the substantially rectangular shape, and has a sixth extended portion that branches off to the outside from the third extended portion and extends to a corner adjacent to the corner where the second external connector is disposed, and a seventh extended portion that branches off to the outside from the fourth extended portion and extends to a corner adjacent to the corner where the second external connector is disposed.

8. The light emitting element according to claim 1, wherein the semiconductor layer has a substantially rectangular shape in top view, the first external connector and the second external connector are disposed opposite each other in the lengthwise direction of the semiconductor layer, the first extended portion and second extended portion that extend from the first external connector are provided so that their distal ends branch off.

9. The light emitting element according to claim 5, wherein the semiconductor layer has a substantially rectangular shape in top view, the first external connector and the second external connector are disposed opposite each other in the lengthwise direction of the semiconductor layer, the first extended portion and second extended portion that extend from the first external connector are provided so that their distal ends branch off.

10. The light emitting element according to claim 1, wherein the first electrode and the second electrode include at least one of nickel, rhodium, chromium, gold, tungsten, platinum, titanium, and aluminum.

11. The light emitting element according to claim 1, wherein the semiconductor layer includes $In_xAl_yGa_{1-x-y}N$ ($0 \leqq X$, $0 \leqq Y$, $X+Y \leqq 1$).

12. The light emitting element according to claim 1, wherein the semiconductor layer is made of gallium nitride-based semiconductor material.

* * * * *